United States Patent [19]
Reber et al.

[11] Patent Number: 6,159,559
[45] Date of Patent: *Dec. 12, 2000

[54] LOW TEMPERATURE, HIGH QUALITY SILICON DIOXIDE THIN FILMS DEPOSITED USING TETRAMETHYLSILANE (TMS)

[75] Inventors: Douglas M. Reber, Austin, Tex.; Stephen J. Fonash, State College, Pa.

[73] Assignee: The Penn State Research Foundation, University Park, Pa.

[*] Notice: This patent issued on a continued prosecution application filed under 37 CFR 1.53(d), and is subject to the twenty year patent term provisions of 35 U.S.C. 154(a)(2).

[21] Appl. No.: 09/110,923

[22] Filed: Jul. 6, 1998

Related U.S. Application Data

[60] Provisional application No. 60/051,823, Jul. 7, 1997.

[51] Int. Cl.[7] .................................................. C23C 16/40
[52] U.S. Cl. .......................... 427/579; 427/162; 427/167; 427/255.37
[58] Field of Search .................................... 427/563, 579, 427/162, 167, 255.37

[56] References Cited

U.S. PATENT DOCUMENTS

| | | | |
|---|---|---|---|
| 4,560,641 | 12/1985 | Kokaku et al. | 430/312 |
| 5,083,033 | 1/1992 | Komano et al. | 250/492.2 |
| 5,156,881 | 10/1992 | Okano et al. | 427/572 |
| 5,314,724 | 5/1994 | Tsukume et al. | 427/489 |
| 5,462,899 | 10/1995 | Ikeda | 437/238 |
| 5,593,741 | 1/1997 | Ikeda | 427/579 |

OTHER PUBLICATIONS

Mat. Res. Soc. Symp. Proc., vol. 282, 1993, pp. 1–6, K. V. Guinn et al., "Chemical Vapor Deposition of $SiO_2$ from Ozone–Organosilane Mixtures Near Atmospheric Pressure" (No Month).

Nara, "Low Dielectric Constant Insulator Formed by Downstream Plasma CVD at Room Temperature Using TMS/02," Jpn. J. Appl. Phys., pp. 1477–1480, Mar. 1997.

Bunshah et al., Deposition Technologies for Films and Coatings, Noyes Publications, Park Rdige, New Jersey, pp. 365–366, 1982 (no month).

*Primary Examiner*—Timothy Meeks
*Attorney, Agent, or Firm*—Thomas J. Monahan

[57] ABSTRACT

Silicon dioxide thin films have been deposited at temperatures from 40° C. to 250° C. by plasma enhanced chemical vapor deposition (PECVD) using tetramethylsilane (TMS) as the silicon containing precursor. The properties of the PECVD TMS oxides (PETMS-Oxs) were analyzed with Fourier TransformInfrared (FTIR) transmissionspectroscopy, BOEand P-etch rates and both current-voltage (I-V) and capacitance-voltage (C-V) electrical characterization. It was found that the deposition rate for films produced from TMS increased with decreasing temperature; that the —OH inclusions could be affected by TMS flow rate; and that He dilution rate affected trapping for films produced over the temperature range explored. At both 130° C. and 250° C., deposition conditions were identified which formed high quality as-deposited oxide films. Under the best conditions, unannealed Al/PETMS-Ox/c-Si capacitor structures displayed flat band voltages of $V_{fb}$ −2.9 V and breakdown fields ($V_{bd}$) in excess of 8 MV/cm. These PETMS-Ox films also show low leakage current densities $<10^{-9}$ $A/cm^2$ which can be maintained up to fields in excess of 4.5 MV/cm. The PETMS oxide electrical quality and process simplicity combined to make an attractive oxide deposition technology for low temperature, large area applications.

14 Claims, 6 Drawing Sheets

LOW TEMPERATURE, HIGH QUALITY SILICON DIOXIDE THIN FILMS DEPOSITED USING TETRAMETHYLSILANE (TMS)

This Application claims priority from Provisional Application Ser. No. 60/051,823, filed Jul. 7, 1997.

The United States Government has license rights in this invention as a result of support of the development thereof by DARPA under contract #F33615-94-1-1464.

FIELD OF THE INVENTION

This invention relates to a method and apparatus for the deposition of oxide films and, more particularly, to an improved low temperature, chemical vapor deposition method for the deposition of silicon dioxide films.

BACKGROUND OF THE INVENTION

Low temperature chemical vapor deposited silicon dioxide thin films are routinely used as passivation and dielectric layers in integrated circuit microelectronics and in large area electronics such as displays and solar photovoltaic cells. In many of these devices, there is a need to reduce the oxide film deposition temperatures while retaining overall uniformity, homogeneity and dielectric quality. For example, in displays and solar cells, commonly employed low temperature glass substrates limit the maximum oxide processing temperature to about 600° C. For dielectrics used between metals in IC manufacturing, the deposition temperature must be below 450° C. to prevent the aluminum in the conductor lines from reacting with the silicon.

High quality oxides deposited at a temperature below 200° C. would be highly useful to the optical coatings industry and could also help bring about the use of plastic substrates for microelectronic devices.

The deposition of high quality silicon dioxide films at temperatures below 400° C. has, to date, been dominated by oxidizing plasma-enhanced chemical vapor deposition (PECVD) reactions which use tetraethyloxysilane (TEOS) or silane as the silicon precursor source. These low temperature oxides have not only been used for TFT device fabrication (see D. Buchanan et al., IEEE Electron Device Letters, V. 9, p. 576 (1988), but are also commonly employed as intermetal-dielectrics and passivation layers in the microelectronics industry (see B. Chin et al., Solid State Technology, p. 119 (April 1988).

Currently, great interest exists in reducing the deposition temperature necessary for high quality silicon dioxide film growth to allow for future applications in flat panel displays, VLSI technology and microelectronics on polymeric substrates. Even though plasma-enhanced CVD TEOS (PETEOS) and silane-based oxides can be deposited with high quality at acceptable deposition rates, these materials do have drawbacks for these envisioned applications. For example, quality PETEOS $SiO_2$ films are difficult to achieve at temperatures below 250° C. (see T. Itani et al., Mat. Res. Soc. Symp., 446, p. 255, (1997). Also, TEOS has a low vapor pressure of about 2 Torr (25° C. and 1 atm.) which necessitates the heating of all delivery lines and chamber surfaces to avoid TEOS condensation. Such low vapor pressure also prevents gas metering with conventional mass flow controllers (see S. Nguyen et al., J. Electrochem. Soc., 137, p. 2209, (July 1990)).

Silane gas, conversely, is easily metered by conventional mass flow controllers (MFCs), but great care must be used because silane is a toxic and pyrophoric gas which constitutes an explosion hazard at high $SiH_4$ concentrations.

Various other gases have been used to achieve PECVD deposition of $SiO_2$ films. U.S. Pat. No. 5,593,741 to Ikeda discloses the use of a CVD method for the deposition of silicon oxide films through the use of TEOS and Oxygen in a plasma reaction chamber (with helium as a carrier) Ikeda's process involve alternate depositions of thin oxide layers, first without a plasma and then with a plasma which provides an ion bombardment to improve the film's properties and the film's conformance to an underlying substrate. Ikeda also indicates that tetramethylsilane (TMS) can be used in the process in lieu of TEOS.

In the examples given by Ikeda, TEOS, octamethylcyclotetrasiloxane and tris(diethylamino)silane are used as the silicon sources and the minimum substrate temperature is given as 300° C. The Ikeda specification, however, quotes a range of deposition temperatures of 200° C. to 400° C., but provides no examples to support substrate temperatures less than 300° C.

In U.S. Pat. No. 5,462,899, Ikeda describes a CVD deposition method for forming a $SiO_2$ layer using TEOS and ozone as the principal reactants. TMS is indicated as being an alternative silicon source. The substrate temperature (for an example using triethoxyfluorosilane) is cited as 400° C. U.S. Pat. No. 5,083,033 to Komano et al. describes the use of TMS as a reactant to produce a silicon oxide layer, using a focused ion beam to create an environment for the surface reaction. Guinn et al. in "Chemical Vapor Deposition of $SiO_2$ from Ozone—Organosilane Mixtures Near Atmospheric Pressure", Materials Research Symposium Proceedings, Vol 282 (1993), indicate that TEOS is 5–10 times more reactive with ozone than is TMS, in a CVD reaction chamber, within a temperature range of 328° C. to 258° C.

As can be seen from the above prior art, the lowest quoted reaction temperature in a plasma chamber used for the deposition of $SiO_2$ (where TMS is a precursor and the results are supported by experimental evidence) is about 250° C.

Accordingly, it is an object of this invention to provide an improved method for the deposition of $SiO_2$ wherein the deposition temperature is less than 200° C.

SUMMARY OF THE INVENTION

A method for forming a silicon oxide film on a substrate by chemical vapor deposition includes the steps of: heating the substrate to a deposition temperature that is less than 200° C. and preferably about 130° C. or less; providing a continuous oxygen plasma source about a surface of the substrate; and providing a metered flow inclusion of tetramethylsilane (TMS) in the excited oxygen species, the metered flow inclusion of TMS adjusted to provide a film whose current density characteristics approximate a film deposited at a temperature of at least 250° C.

DETAILED DESCRIPTION OF THE PREFERRED EMBODIMENT

To accomplish deposition of $SiO_2$ layers on semiconductor structures through use of the invention, tetramethylsilane (TMS) is used as the precursor for its quality and its ability to enable low temperature oxide growth. TMS is known to be non-toxic and non-pyrophoric and its high vapor pressure ~580 Torr allows for conventional MFC use at room temperature. Thus, TMS avoids the health and safety issues associated with silane and the manufacturing complexities inherent with TEOS. Further, each parent TMS molecule ($Si(CH_3)_4$))contains half as much carbon and ⅗ths as much hydrogen as a TEOS molecule (Si $(OC_2H_5)_4$), and it is hypothesized that carbon and hydrogen free films will be obtainable at lower temperatures. Also, s greater dissociation is possible at lower temperatures with TMS because its Si—C bond has a lower bond energy than the Si—H bond in silane and Si—O bond in TEOS.

Applicants have found that all of these features of TMS are indeed valid and most importantly have shown, for the first time, that thin-film transistor (TFT) gate quality oxides can be deposited at as low as 130° C. using tetramethylsilane in a plasma reaction. TMS oxide deposition conditions have been found to mimic very closely, the conditions found to produce high quality PECVD TEOS oxides in the semiconductor industry. In particular, a relatively high pressure of about 3 Torr is used to decrease the plasma potential, increase the atomic-oxygen concentration and lessen the effect of residual chamber gases.

Helium can be added to the precursor gases. When added, it is done so for several important reasons: it improves deposition uniformity; it aids in TMS fragmentation by the Penning effect, He ion bombardment or both; it does not participate in chemical bonds; its small size prevents its inclusion in the film from disrupting the growing film; and it causes negligible ion damage to the growing film.

Experimental Procedure

Figure 1:
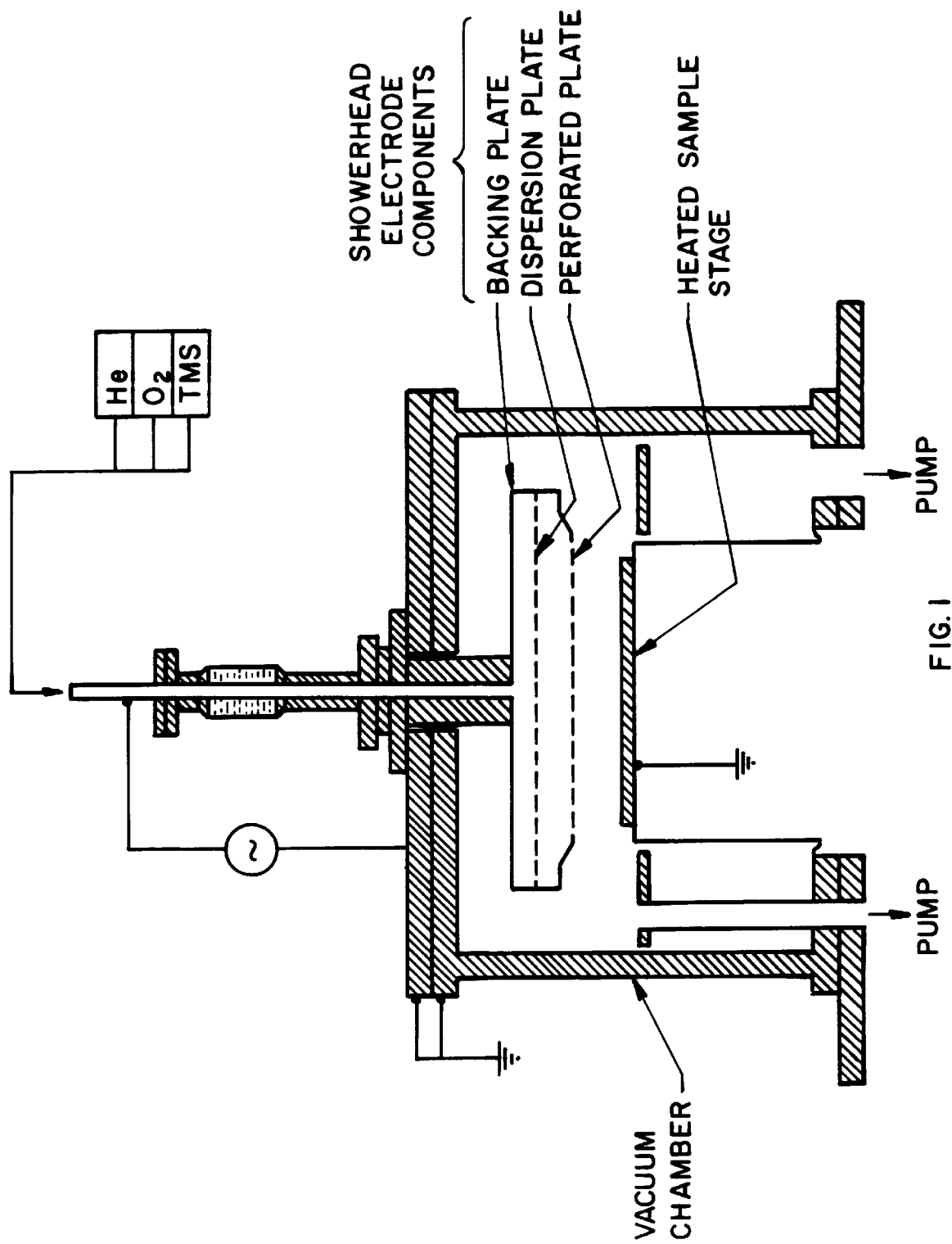
FIG. 1 is a schematic showing of a capacitively coupled plasma reactor used to implement the method of the invention.

Sixty $SiO_2$ 400–850 Å thin films were deposited on 6" 10–25 Ω-cm p-type <100>c-Si wafers using TMS (Alfa Aesar 99.9%) and UHP $O_2$. The depositions were performed in a capacitively coupled rf (13.56 MHz) PECVD reactor, schematically shown in FIG. 1. A 1 cm separation was used between the 6" wafer, TEOS showerhead top electrode and the heated sample stage. The TMS vapor was delivered under its own vapor pressure, without heating. The vapor was metered using a standard MFC with an assumed calibration factor of 0.18 relative to $N_2$.

Each wafer sample was initially cleaned in acetone, isopropyl alcohol, and deionized water before the native oxide was stripped in 10:1 buffered HF (BOE). The base pressure was $<1 \times 10^{-6}$ Torr and processing pressures ranged from 0.5 Torr to 8 Torr. For all samples, a predeposition $O_2$ plasma (no TMS) surface treatment was performed prior to the bulk oxide deposition to remove any residual carbonaceous matter and to define the Si wafer surface. Following the predeposition, a similar $O_2$ plasma without TMS was struck at the same pressure, rf power, and gas flow rates as desired for the bulk oxide deposition.

The bulk PETMS-Ox film deposition then took place with injection of a small TMS flow into the stabilized plasma. To stop the deposition, the TMS flow was halted, but the plasma remained on to remove any residual TMS byproducts. The rf power, deposition temperature, and $O_2$ and TMS flow rates were varied between 40–70 W, 40–250° C., 31.2–660 sccm and 0.43–1.2 sccm, respectively. UHP He dilution was also investigated in some predepositions and bulk depositions to mimic published accounts of TEOS and silane based PECVD oxide deposition conditions.

Following the PETMS-Ox growth, the wafer samples were halved. On one-half wafer, MOS-capacitance structures were fabricated by high vacuum thermal evaporation of Al through a shadow mask, forming 1 $mm^2$ gate electrodes on the oxide and a blanket Al deposition on the BOE-etched wafer's backside. On the MOS-capacitors, both quasi-static and high-frequency C-V, and I-V dynamic sweeps (1 V/s) were performed with a Keithly KI-82 system. On the second half wafer, film thicknesses were measured with elipsometry and FTIR, BOE etch rate, and P-etch ($HF:HNO_3:H_2O=1.5:1:30$) rate measurements were performed.

Experimental Results
Deposition Temperature Effects

One very sensitive measure of a deposited oxide's quality is its current-voltage (I-V) dynamic sweep behavior. A quality oxide will display very low leakage currents of $<10^{-8}$ $A/cm^2$ at electric fields below that required for the onset of Fowler-Norheim (F-N) tunneling (typically 5–6 MV/cm). The I-V dynamic sweeps for PETMS-OX films deposited at temperatures between 40° C. and 250° C. at 40 W and 8 Torr with He:$O_2$:TMS flows of 200:31.2:1.18 sccms are shown in FIG. 2.

Figure 2:
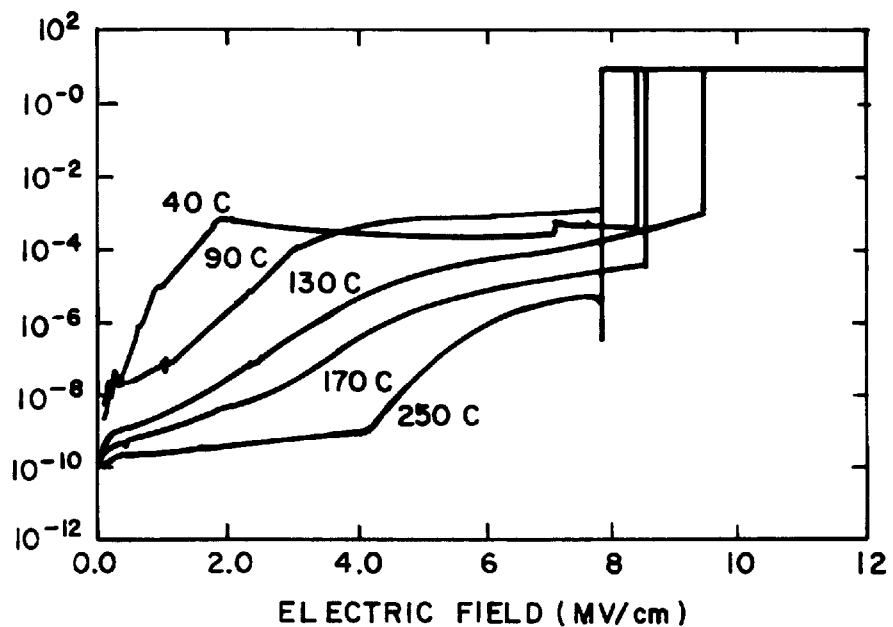
FIG. 2 is a plot of current density versus electric field for I-V dynamic sweeps of PETMS-Ox films deposited at temperatures between 40 and 250° C. at 40 W and 8 Torr with He:$O^2$ flows of 200:31.2.1.18 sccms.

FIG. 2 shows that a 250° C. oxide, produced under the above deposition conditions, has a leakage current of $<10^{-9}$ $A/cm^2$ at electric fields below 3 MV/cm, but, the leakage current for the lower temperature films becomes progressively higher, with reduced deposition temperature. Also, the leakage current density for the 40–170° C. films rises quickly and then becomes saturated (shows a "ledge") This behavior has been studied previously in deposited oxides and it results from localized electric field reductions due to electron trapping in the oxides.

Figure 3:
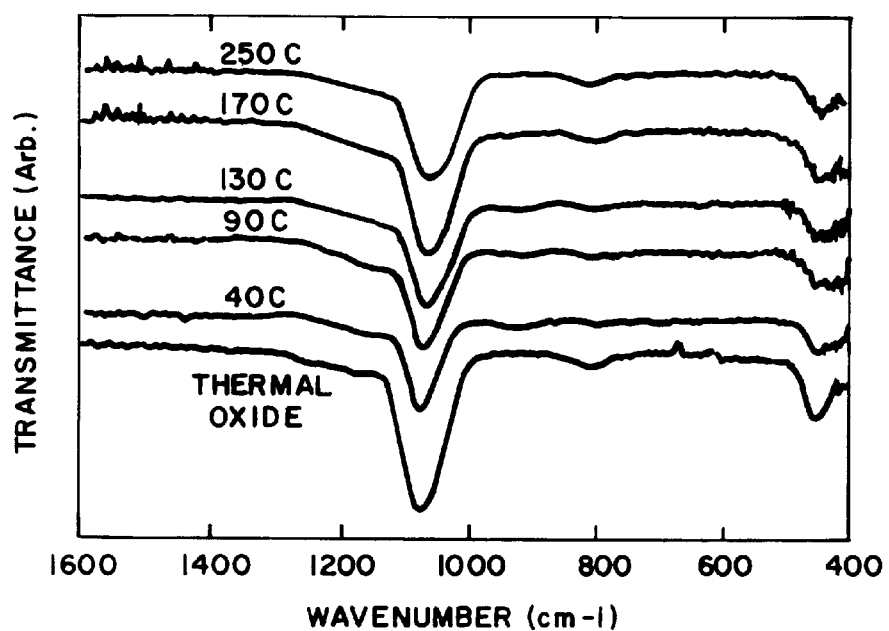
FIG. 3 is a plot of transmittance versus wavenumber of FTIR spectra for PETMS-Ox films deposited at temperatures between 40 and 250° C. at 40 W and 8 Torr with He:$O^2$ flows of 200:31.2.1.18 sccms. The spectra for an as-grown thermal oxide is provided for reference.

Although these current ledges can occur in deposited oxides which are silicon rich, the ledges observed in FIG. 2 correlate to the presence of Si—OH in the lower temperature films. FIG. 3 shows this. It gives the IR spectra for the same deposition conditions presented in FIG. 2 along with the spectrum for a thermally grown oxide for reference. These data show that while the thermal oxide and the PETMS oxides have similar Si—O bending, and rocking peaks present at wavenumbers of ~808, and ~457 $cm^{-1}$, respectively, there is a Si—OH peak at ~933 $cm^{-1}$, which is not present in the thermal oxide or the 250° C. oxide. This peak becomes increasingly apparent in the PETMS oxides as the deposited temperature is reduced. Furthermore, the Si—O stretching peak for PETMS oxides appears at 1062 $cm^{-1}$ for the 250° C. film and shifts to higher wavenumbers as the deposition temperature is reduced. In fact, the Si—O stretching peak for the 40° C. oxide is found to be the same as that for the thermal oxide, 1073 $cm^{-1}$.

It has been shown that the location of the Si—O—Si stretching peak increases in thermal oxides as their density decreases. However, the viscoelastic relaxation induced density decrease which results from increasing the growth temperature between 700° C. and 1100° C. in thermal oxides cannot occur in the PETMS oxides because the deposition temperature is too low. Alternatively, it is likely that stress relaxation occurs due to the increased incorporation of non-bridging Si—OH bonds in these oxides. It is noted that the measured film thicknesses were found to be 694, 856, 739, 709, and 622 Å for the 250, 170, 130, 90, and 40° C. films, respectively. Therefore, the larger concentrations of Si—OH found with reduced deposition temperatures are not the result of thicker films at the reduced temperatures. Also, no carbon by-products were detected by FTIR for any of the films deposited in this work.

Figure 4:
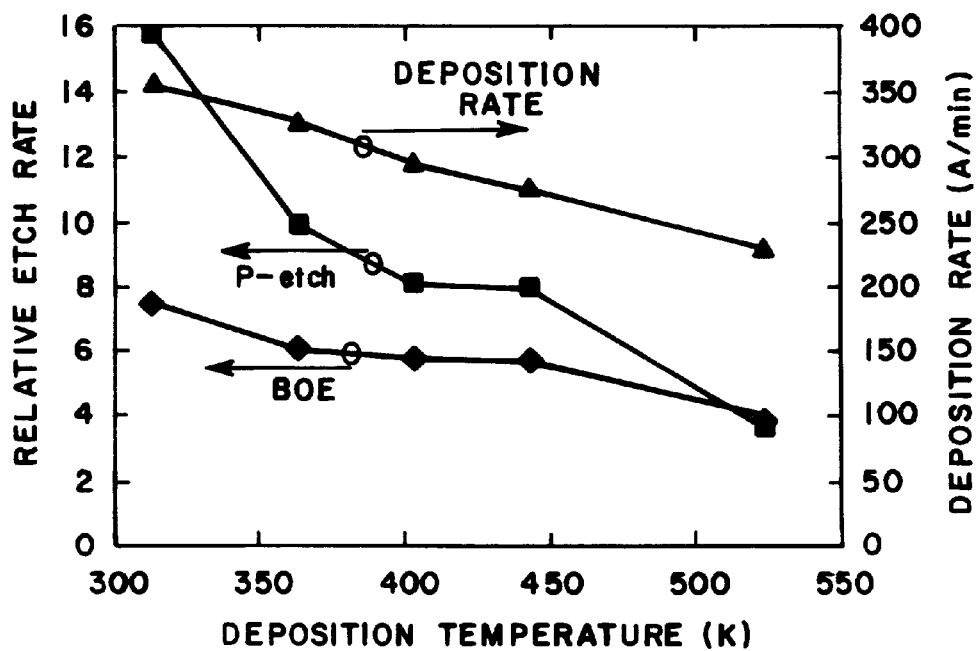
FIG. 4 is a plot of relative etch rate versus deposition temperature for P- and buffered oxide etch (BOE) rates relative to thermal oxide and deposition rates for PETMS-Ox films deposited at temperatures between 40 and 250° C. at 40 W and 8 Torr with He:$O^2$ flows of 200:31.2.1.18 sccms.

To further study the influence of the Si—OH incorporation on the properties of the $SiO_2$ films, the deposition and etch rates were examined. FIG. 4 shows that deposition rate increased from 231 Å/min to 356 Å/min, while the BOE relative etch rate increased from 4.0 to 7.5, between the 250° C. and 40° C. films, respectively. Correspondingly, the P-relative etch rate increased from 3.7 to 15.8. These results show that under conditions which are favorable for Si—OH incorporation, a stress reduction indicated by the Si—O stretching peak location accompanies a reduction in the film's density, leading to higher etch rates and a degradation of the film's dielectric properties. Note that a higher etch rate implies a lower quality film.

In an attempt to remove the Si—OH from the lower temperature films, both the deposition pressure and the TMS flow rate were investigated.

Figure 5:
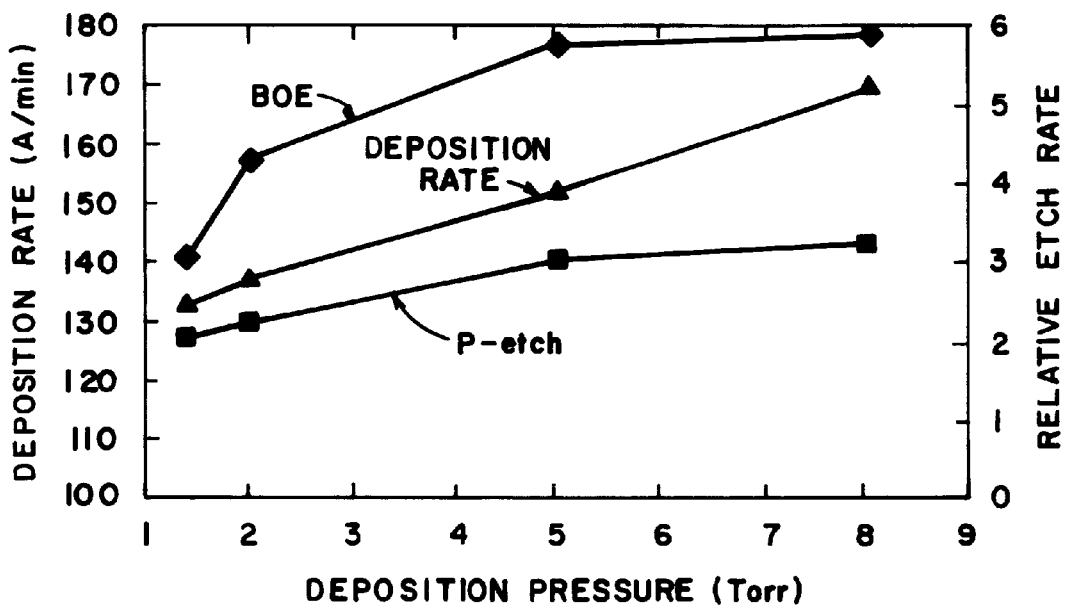
FIG. 5 is a plot of deposition rate versus deposition pressure for both BOE and P-etch rates relative to thermal oxide for PETMS-Ox films grown at 250° C., 40 W, $O_2$:TMS 660:1.2 sccm at various deposition pressures.

The as-deposited PETMS-Ox film deposition rate and BOE and P-etch rates relative to thermally grown oxide for films deposited at 250° C. and 40 W with $O_2$:TMS 660:1.2 sccm are shown in FIG. 5. FIG. 5 shows that as the deposition pressure is reduced from 8 Torr to 1.4 Torr, the deposition rate is seen to decrease from 178.7 Å/min to 140.53 Å/min, while the relative etch rate decreased from 3.26 to 2.04 in a BOE, and 5.22 to 2.46 for a P-etch. This reduction in deposition raze at the lower deposition pressures is likely due to the reduced TMS concentration in the reactor. The lower P- and BOE relative etch rates at these lower deposition pressures suggests that higher density films, with possibly less by-products, are formed due to the higher degree of ion bombardment at lower deposition pressures.

Based solely on FIG. 5, one might expect higher quality oxides at lower temperatures, if a 1.4 Torr deposition pressure is used. However, as the deposition pressure is decreased in the reactor, a flow-field non-uniformity effect arose due to non-symmetric exhaust pumping. This flow field effect was detected by wafer mapping of current spikes in the dynamic I-V sweeps (wafer maps not shown). The number and severity of the spikes was found to become progressively worse as the deposition pressure was reduced. It was therefore found that careful consideration had to be given to flow design to assure uniformity thereof.

Figure 6:
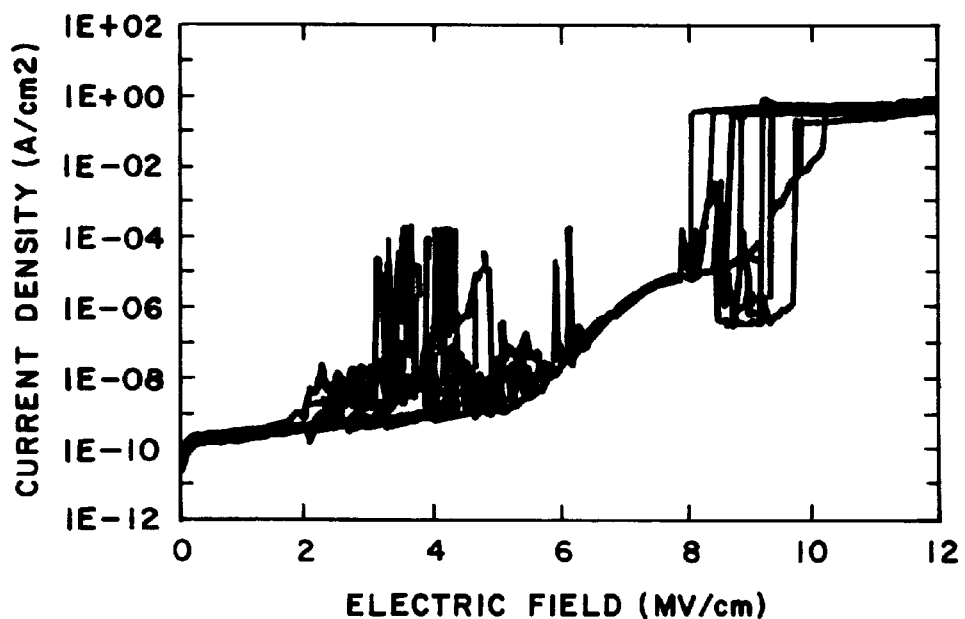
FIG. 6 is a plot of current density versus electric field for I-V dynamic sweeps for PETMS-Ox films deposited at 1.4 Torr, 250° C. and 40 W with 660:1.2 sccm of $O_2$ and TMS, respectively.

As an example, FIG. 6 shows the I-V dynamic sweeps for 12 MOS-Capacitors on a single PETMS oxide, deposited at 1.4 Torr, 250° C., and 40 W with 660:1.2 sccm of $O_2$ and TMS, respectively. Here, non-symmetric exhaust pumping was present.

To determine the physical mechanism behind these current spikes, successive dynamic sweeps were performed on a 1.4 Torr oxide MOS-capacitor. These tests showed that the spikes were filamentary electron conduction paths which burn-out to a greater degree with each successive sweep. Therefore, despite the fact that these spikes could be eliminated by voltage cycling, the unwanted current spikes became more prevalent and pronounced at reduced deposition pressures.

Figure 7:
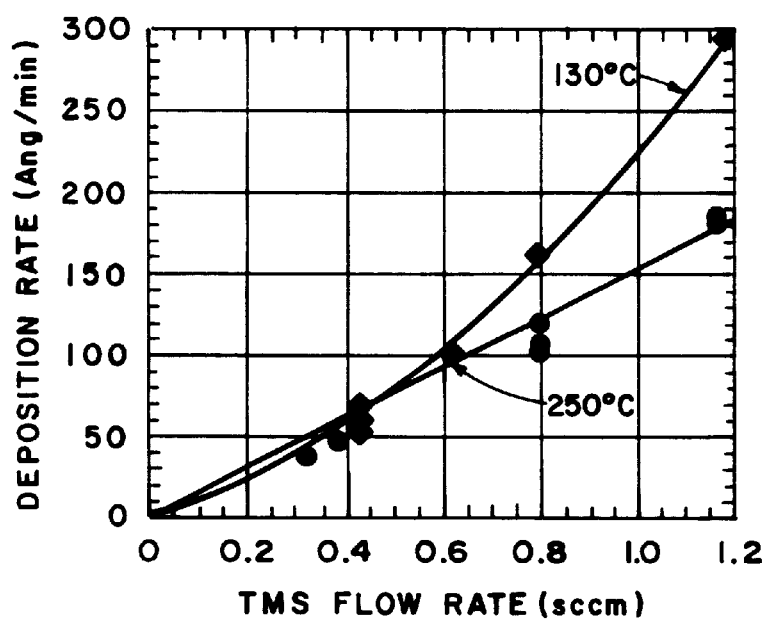
FIG. 7 is a plot of deposition rate versus TMS flow rate for PETMS-Ox as a function of TMS feed flow rate for films deposited at 250° C. and 3 Torr and 130° C. and 8 Torr.

The PETMS oxide deposition rate as a function of TMS flow rate is shown in FIG. 7 for films deposited at 130° C. and 8 Torr (with He dilution) compared to films deposited at 250° C. and 3 Torr. For the 250° C. films, FIG. 7 shows that the oxide deposition rate increases in direct proportion to the TMS flow rate at 154 Å/min-sccm. Also, the 130° C. oxides deposited at TMS flow rates up to 0.5 sccm, appear to follow a similar deposition rate behavior. However, it is clear from FIG. 7 that 130° C. films, deposited at TMS flow rates above 0.5 sccm, deposit at an increasingly faster rate with increasing TMS flows than do the 250° C. oxides.

In looking at the FTIR for these films, the 250° C. oxides showed no obvious signs of Si—OH while the 130° C. films deposited at 0.79 and 1.2 sccm displayed clear Si—OH absorption peeks at 933 $cm^{-1}$ (implying less dense oxides). Similarly, the I-V dynamic sweeps for the 250° C. oxides did not show Si—OH electron trapping ledges, but I-V spikes were present due to the reduced deposition pressure, while the 130° C. films deposited at TMS flow rates above 0.62 sccm did have trapping ledges.

The results discussed above and FIG. 7 therefore, show that at reduced temperatures, Si—OH incorporation in the PETMS-Ox can be reduced by reducing the TMS flow feed rate.

TFT Gate Dielectric Quality PETMS Deposition Conditions

Figure 8:
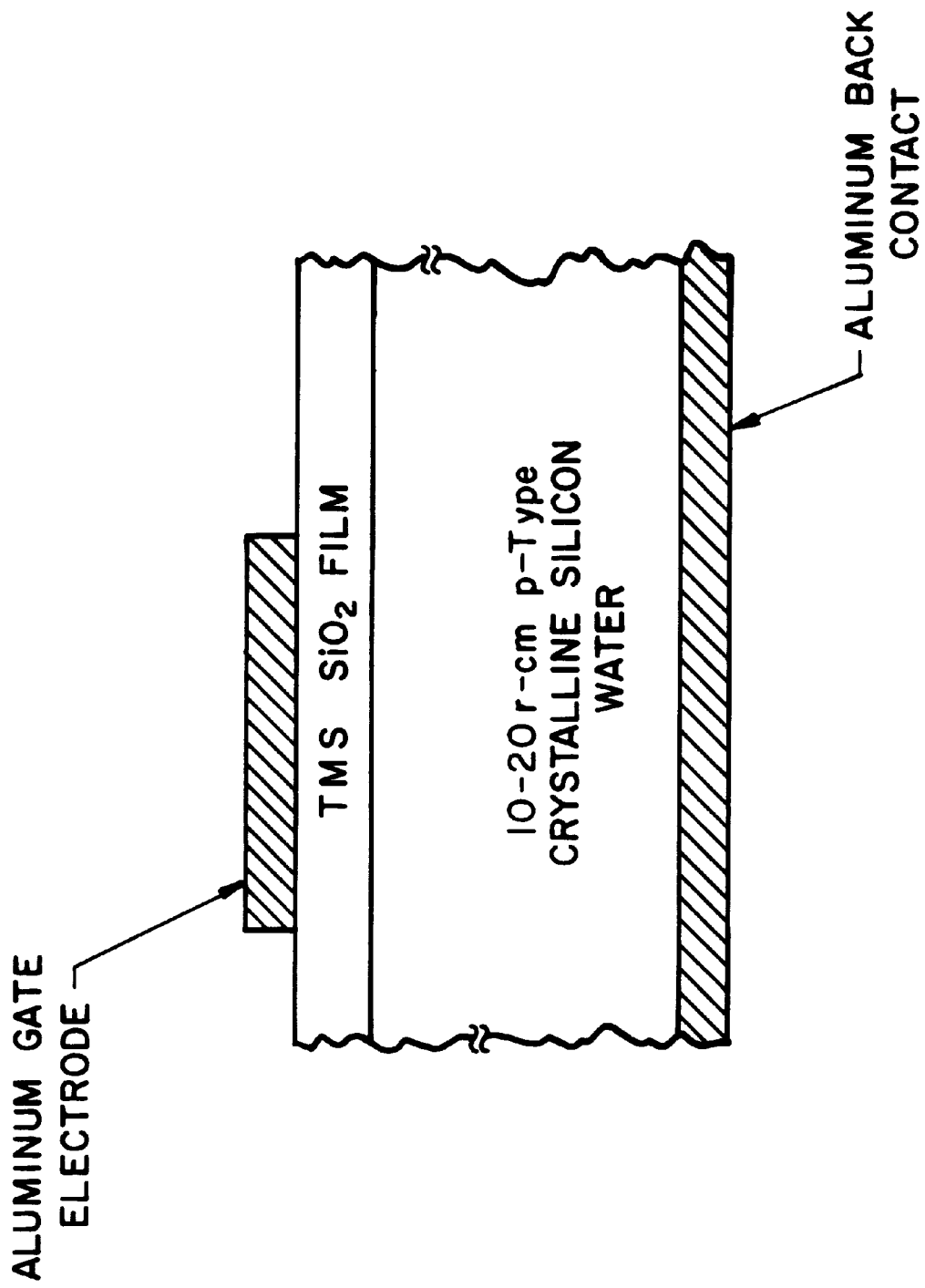
FIG. 8 is a schematic sectional view of a semiconductor structure on which a TMS $SiO_2$ film has been deposited in accord with the invention.
Figure 9:
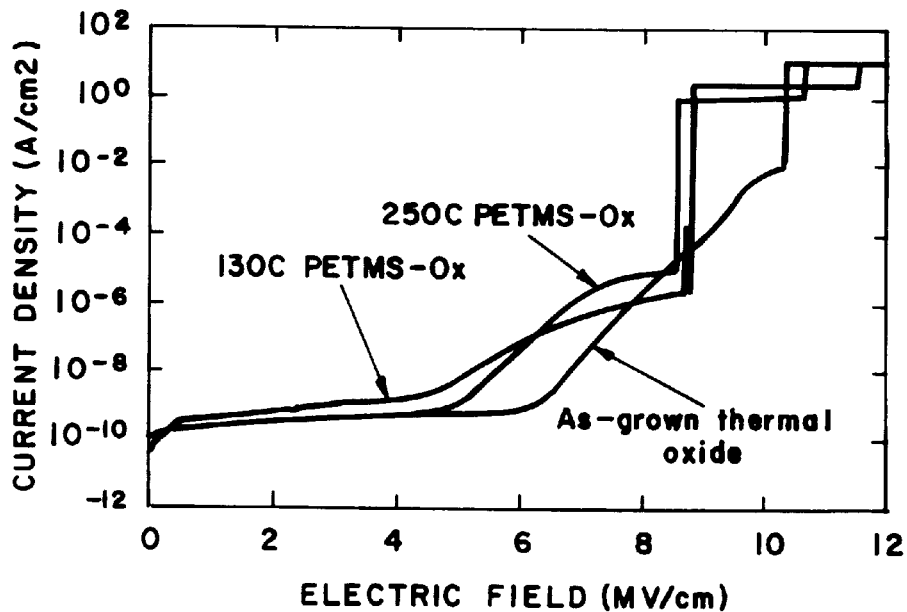
FIG. 9 is a plot of current density versus Electric field of I-V dynamic sweeps for (a) PETMS-Ox deposited at 250° C., 8 Torr, 40 W, and 660:1.2 $O_2$:TMS sccm, (b) PETMS-Ox deposited at 130° C., 8 Torr, 40 W, and 200:31:43 He:$O_2$:TMS sccm and (c) as-grown thermal oxide.
Figure 10:
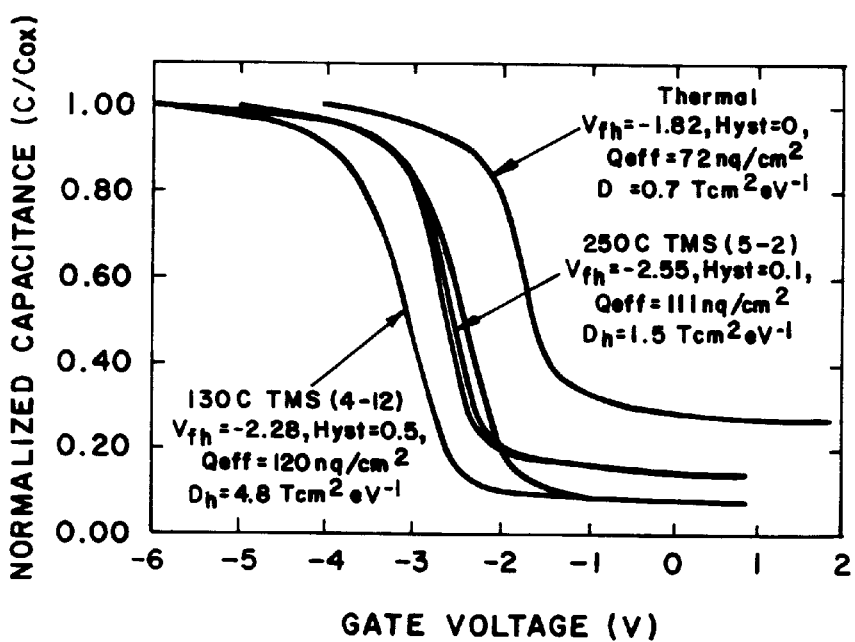
FIG. 10 is a plot of normalized capacitance versus gate voltage of high frequency C-V curves for (a) PETMS-Ox deposited at 250° C., 8 Torr, 40 W, and 660:1.2 $O_2$:TMS sccm, (b) PETMS-Ox deposited at 130° C., 8 Torr, 40 W, and 200:31:43 He:$O_2$:TMS sccm and (c) as-grown thermal oxide.

The I-V dynamic sweeps and high-frequency C-V characteristics for as-grown thermal oxides (see FIG. 8) are shown in FIGS. 9 and 10, along with the typical characteristics for gate quality TMS films deposited at 250° C. and 130° C. Here, the TMS deposition conditions used are centered around the 8 Torr deposition pressure to reduce the flow field non-uniformity effects and low TMS flow rates for the 130° C. film, since these were found to reduce Si—OH related electron trapping.

Specifically, the 250° C. deposition conditions are 8 Torr, 40 W and 660:1.2 $O_2$:TMS sccms, and the 130° C. oxide deposition conditions are 8 Torr, 45 W, 200:31:0.43 sccms of He:$O_2$:TMS. It is noted that He was found to be very advantageous for low temperature oxide films (e.g., 130° C.). The 130° C. oxide films, for example, were found to have reduced trapping ledge levels when deposition was performed with a high degree of helium dilution.

In FIG. 9, it can be seen that I-V characteristics of both the 130° C. and 250° C. TMS oxides are similar to the as-grown thermal oxide in that they all have leakage currents below $10^{-9}$ A/cm$^2$ at electric fields <4.5 MV/cm. The PETMS oxides also exhibit breakdown fields of >8 MV/cm whereas the thermal oxide has a breakdown field of >10 MV/cm. The PETMS oxides do, however, show a slight trapping ledge in both 130° C. and 250° C. oxides which indicates small amounts of deep electron traps to be present. This fact is further evidenced by the C-V characteristics for the oxides.

The results shown in FIG. 9 indicate that by controlling the feed rate of TMS, that SiO$_2$ films produced by the invention at relatively low temperatures (e.g., 130° C.) are substantially equivalent in characteristics to SiO$_2$ films produced at 250° C.

In FIG. 10, it can be seen that while the thermal oxide has a flat band voltage of Vfb=−1.82, hysteresis of H=0, effective oxide charge of Qeff=7×10$^{-9}$ /cm$^2$, and interface state density of Dit=0.7×10$^{12}$ cm$^{-2}$ eV$^{-1}$, the 250° C. PETMS oxide has Vfb=−2.55, H=0.1, $Q_{\mathit{eff}}$=111×10$^{-9}$ coul/cm$^2$, and $D_{it}$=0.5×10$^{12}$ cm$^{-2}$ eV$^{-1}$ while the 130° C. oxide has Vfb=−2.88, H=0.5, $Q_{\mathit{eff}}$=120×10$^{-9}$ coul/cm$^2$, and $D_{it}$=4.8×10$^{12}$ cm$^{-2}$ eV$^{-1}$.

In summary, high quality silicon dioxide films have been deposited at temperatures of 130° C. and 250° C., using tetramethylsilane in a capacitively coupled PECVD system. Under the best conditions, the unannealed Al/PETMS-Ox/c-Si capacitor structures displayed flat band voltages of $V_{fb}$=−2.9 V and breakdown fields ($V_{bd}$) in excess of 8 MV/cm. Those PETMS-Ox films also showed low leakage current densities <10$^{-9}$ A/cm$^2$ which could be maintained up to fields in excess of 4.5 MV/cm.

It was found for the first time that TMS oxide deposition rates could be increased by lowering deposition temperatures. It was also found that He dilution could be used to reduce trapping in low temperature deposition temperature films. Also, by carefully metering the TMS flow rates into the reactor, the presence of OH inclusions in the SiO$_2$ films could be substantially reduced, leading to high quality films at temperatures substantially below any reported by others. Importantly, there appears to be no reason why such high quality films cannot be produced at even lower temperatures, by adjusting the TMS flow rate downward to prevent an excess of OH ions from being incorporated into the SiO$_2$ layer. Of course, such lower TMS flow rates imply longer processing times—however they allow film depositions on polymeric substrates—an important commercial application.

It should be understood that the foregoing description is only illustrative of the invention. Various alternatives and modifications can be devised by those skilled in the art without departing from the invention. For example, while a capacitively coupled plasma reactor was utilized in producing the SiO$_2$ films, other plasma reactors can also be used. Further, instead of mixing the gases in the reaction chamber, they can be mixed in an upstream chamber and then fed into the reaction chamber. Accordingly, the present invention is intended to embrace all such alternatives, modifications and variances which fall within the scope of the appended claims.

What is claimed is:

1. A method for forming a silicon oxide film on a substrate by chemical vapor deposition in the presence of a plasma, comprising the steps of:

heating said substrate to a deposition temperature that is within a range of from 40° C. to 200° C.;

providing a continuous plasma discharge about a surface of said substrate to enable deposition of products thereof on said surface said products comprising oxygen atoms, radicals, and ions;

providing a metered amount of tetramethylsilane (TMS) in said plasma discharge, said metered amount of TMS adjusted to enable deposition of a film of SiO$_2$ on said substrate; and depositing said film of SiO$_2$ on said substrate;

said film of SiO$_2$ exhibiting a leakage current density less than 10$^{-9}$ A/cm$^2$ at electric fields up to about 4.5 MV/cm.

2. The method as recited in claim 1, wherein said plasma discharge products include a major proportion of oxygen atoms, radicals and ions.

3. The method as recited in claim 1, wherein said metered amount of TMS is adjusted to reduce —OH inclusions in said film at said deposition temperature, thereby reducing a potential for leakage currents in said SiO$_2$ film when a voltage is applied thereacross.

4. The method as recited in claim 1, wherein said continuous plasma is created in a reaction chamber including said substrate and said metered amount of TMS is fed to said reaction chamber.

5. The method as recited in claim 1, wherein said deposition temperature is from about 40° C. to about 130° C.

6. The method as recited in claim 1, wherein said plasma discharge products include a major proportion of oxygen ions, said method further comprising the added step of:

providing a metered amount of helium in said plasma.

7. The method as recited in claim 1, wherein said substrate comprises at least one of: a semiconductor, a glass, a polymer, a metal foil or combinations thereof.

8. The method as recited in claim 1, wherein said substrate comprises an optic of either glass or a polymer and said silicon oxide film comprises a layer supported by a surface of said optic.

9. The method of claim 1, wherein said plasma results in a decreased deposition rate of said film with increased temperature in said range of from 40° C. to 200° C.

10. A method of forming a silicon oxide film on a substrate by chemical vapor deposition in the presence of a plasma, comprising:

contacting product of a continuous plasma discharge and a metered amount of tetramethylsilane to produce SiO$_2$ said products comprising oxygen atoms, radicals, and ions; and depositing SiO$_2$ on a substrate at a temperature from 40° C. to 200° C. to form a silicon oxide film;

wherein said film exhibits a leakage current density less than 10$^{-9}$ A/cm$^2$ at electric fields up to about 4.5 MV/cm.

11. The method of claim 10, wherein said contacting is carries out in a reaction chamber containing said substrate.

12. The method of claim 11, wherein said contacting and depositing steps are simultaneous.

13. The method of claim 10, wherein said plasma discharge is formed in an upstream plasma chamber.

14. The method of claim 13, further comprising:

introducing said products of said plasma discharge produced in said upstream chamber into a reaction chamber containing said substrate and contacting said tetramethylsilane with said products in said reaction chamber.

* * * * *